United States Patent

[15] 3,683,240
[45] Aug. 8, 1972

Pankove

[54] ELECTROLUMINESCENT SEMICONDUCTOR DEVICE OF GAN

[72] Inventor: Jacques Issac Pankove, Princeton, N.J.

[73] Assignee: RCA Corporation

[22] Filed: July 22, 1971

[21] Appl. No.: 165,097

[52] U.S. Cl. ....317/234 R, 317/235 N, 317/235 AD, 148/175

[51] Int. Cl. .......................................... H01l 15/00

[58] Field of Search .....317/235 N, 235 AD; 148/175

[56] References Cited

UNITED STATES PATENTS 3,560,275 2/1971 Kressel ......................148/171

*Primary Examiner*—Martin H. Edlow
*Attorney*—Glenn H. Bruestle

[57] ABSTRACT

An electroluminescent semiconductor device including a body of insulating, crystalline gallium nitride and a pair of contacts electrically connected to spaced points of the body.

8 Claims, 4 Drawing Figures

INVENTOR.
Jacques I. Pankove
BY
Donald S. Cohen
ATTORNEY

ELECTROLUMINESCENT SEMICONDUCTOR DEVICE OF GAN

BACKGROUND OF THE INVENTION

The present invention relates to an electroluminescent semiconductor device in which the active material is a body of crystalline gallium nitride.

Electroluminescent semiconductor devices in general are bodies of a single crystalline semiconductor material which when biased emit light, either visible or infrared, through the recombination of pairs of oppositely charged carriers. Such devices generally include regions of opposite conductivity type forming a PN junction therebetween. When the junction is forwardly biased, charge carriers of one type are injected from one of the regions into the other where the predominant charge carriers are of the opposite type so as to achieve the light emitting recombination. Such semiconductors have been made of the group III–V compound semiconductor materials, such as the phosphides, arsenides, and antimonides of aluminum, gallium and indium, and combinations of these materials because the high-band gap energy of these materials allows emission of visible and near infrared radiation.

A group III–V compound semiconductor material which has been recently made in single crystalline form and which should be suitable for making electroluminescent semiconductor devices because of its high band gap energy is gallium nitride, GaN. Although luminescence has been induced in GaN by electron-beam and optical excitation, heretofore electroluminescence in this material has not been achieved. The single crystalline GaN which has been formed to date has been of highly conductive N type conductivity because of native, uncontrolled donors, such as nitrogen vacancies, which are inherently formed in the material. So far, attempts to include acceptor impurties in the GaN to form regions of P type conductivity have been unsuccessful. Therefore, it has not been possible to form a body of GaN having a PN junction, which has been felt to be necessary to form an electroluminescent semiconductor device.

SUMMARY OF THE INVENTION

An electroluminescent semiconductor device which includes a body of insulating crystalline gallium nitride and a pair of contacts electrically connected to spaced points on the body.

DETAILED DESCRIPTION

Figure 1:
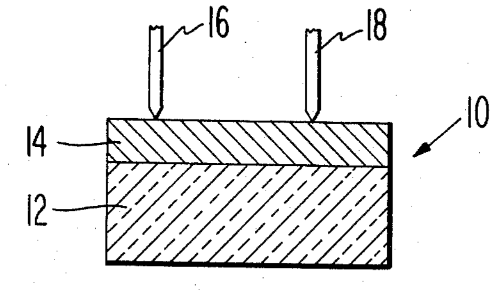
FIG. 1 is a sectional view of one form of the electroluminescent semiconductor device of the present invention.

Referring initially to FIG. 1, one form of the electroluminescent semiconductor device of the present invention is generally designated as 10. The electroluminescent semiconductor device 10 comprises a substrate 12 of an electrical insulating material which is optically transparent, such as sapphire. A body 14 of insulating crystalline gallium nitride is on a surface of the substrate 12. The gallium nitride body is epitaxially deposited on the substrate 12 such as by the vapor phase epitaxy technique described in the article "The Preparation and Properties of Vapor-Deposited Single-Crystalline GaN" by H. P. Maruska and J. J. Tietjen published in APPLIED PHYSICS LETTERS, Volume 15, page 327 (1969). In the deposition of gallium nitride body 14, and acceptor impurity, such as zinc, cadmium, beryllium, magnesium, silicon or germanium, is included in the body. A sufficient amount of the acceptor impurity is introduced into the gallium nitride body 14 to compensate substantially all of the native donors inherently formed in the gallium nitride thus making the body 14 insulating. A pair of contacts 16 and 18 are electrically connected to spaced points on the body 14. As shown, the contacts 16 and 18 are spaced point contacts physically held in engagement with the surface of the body 14.

When a D.C. current is passed between the two contacts 16 and 18 a blue light at a wave length of about 2.6 e.V (about 4700 A) is emitted by the gallium nitride body 14 and can be seen through the substrate 12. This light emission can be achieved at room temperature at a breakdown voltage of between 60 and 100 volts depending on the position and spacing of the contacts 16 and 18 which spacing may be between 100 and 1,000 microns. Electroluminescence is achieved no matter which of the contacts is positive or which is negative. The intensity of the emitted light varies approximately as the 3/2 power of the current over at least two orders of magnitude which may vary between 0.01 and 1mA. The light intensity at 0.2mA is bright enough to be easily seen in a well-lit room. It is believed that the emission of light from the insulating gallium nitride body 14 results from the high field causing the release of electrons trapped in the acceptor centers and a subsequent avalanche multiplication of free electrons and holes. The recombination of these carriers being radiative to emit the light.

Figure 2:
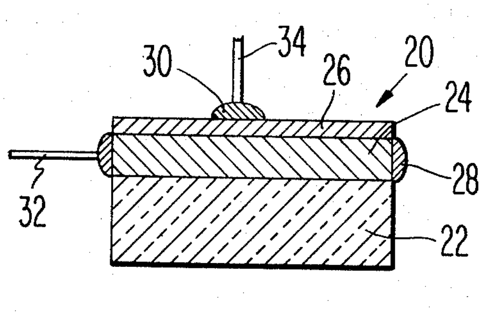
FIG. 2 is a sectional view of another form of the electroluminescent semiconductor device of the present invention.

Referring to FIG. 2, another form of the electroluminescent semiconductor device is generally designated as 20. The electroluminescent semiconductor device 20 comprises a substrate 22 of an electrically insulating material which is optically transparent, such as sapphire. On a surface of the substrate 22 is a body 24 of N type conductive crystalline gallium nitride, which has a conductivity of about $10^2$mohs, and on the surface of the conductive gallium nitride body 24 is a thin body 26 of insulating crystalline gallium nitride. The gallium nitride bodies 24 and 26 can be epitaxially deposited on the substrate 22 by the vapor phase epitaxy technique previously referred to. During the initial step of the deposition process little or no acceptor impurity is included so that the initial portion of the deposited gallium nitride is conductive to form the conductive gallium nitride body 24. When a conductive gallium nitride body 24 of the desired thickness has been deposited, sufficient acceptor impurity is included so as to deposit insulating gallium nitride to form the insulating gallium nitride body 26. A metal contact layer 28, such as of indium, is coated on the periphery of the conductive gallium nitride body 24 so that the conductive body 24 and the contact layer 28 serve as a contact to one side of the insulating body 26. A metal contact layer 30, which may also be of indium, is coated on the surface of the insulating gallium nitride body 26. The contact 28 may overlap the insulating gallium nitride body 26 as long as the distance between the electrodes 28 and 30 is large compared to the thickness of the insulating body 26. Terminal wires 32 and 34 are connected to the contact layers 28 and 30 respectively.

When the terminal wires 32 and 34 are connected across a source of D.C current so as to pass the current between the contacts 28 and 30, light is emitted by the insulating gallium nitride body 26. The light can be seen through the substrate 22 and the conductive gallium nitride body 24. The light emitted by the insulating gallium nitride body 26 will be either blue or green in color depending on the concentration of the acceptor impurity in the insulating gallium nitride body. It appears that a high concentration of the acceptor impurity will create a blue light whereas a lower concentration will create the green light.

Figure 3:
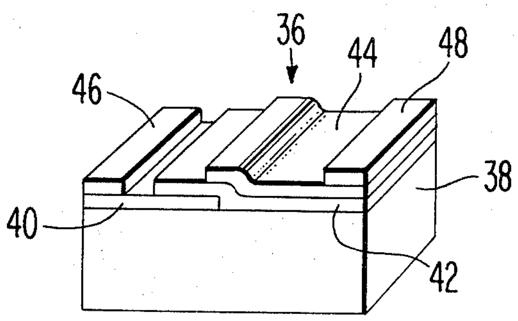
FIGURE 3 is a perspective view of a third form of the semiconductor device of the present invention.

Referring to FIG. 3, still another form of electroluminescent semiconductor device is generally designated as 36. The electroluminescent semiconductor device 36 comprises a substrate 38 of an electrical insulating material, such as sapphire, having a first thin layer 40 of conductive gallium nitride on a portion of a surface thereof. A body 42 of insulating gallium nitride in the form of a thin layer is on the remaining portion of the surface of the substrate 38 and extends over a portion of the first thin layer 40 of conductive gallium nitride. A second thin layer 44 of conductive gallium nitride is on the surface of the body 42 of insulating gallium nitride. The second layer 44 of conductive gallium nitride extends over the portion of the body 42 of insulating gallium nitride which is on the surface of the substrate 38 and over a portion of the body 42 which extends over the first layer 40 of conductive gallium nitride. Thus, a portion of the insulating gallium nitride body 42 is sandwiched between the conductive gallium nitride layers 40 and 44. Metal contacts 46 and 48 are on the surfaces of the conductive gallium nitride layers 40 and 44 respectively. The first conductive gallium nitride layer 40 and the metal contact 46 serve as the electrical contact to one side of the insulating gallium nitride body 42 and the second conductive gallium nitride layer 44 and the metal contact 48 serve as the electrical contact to the other side of the insulating body 42.

Figure 4:
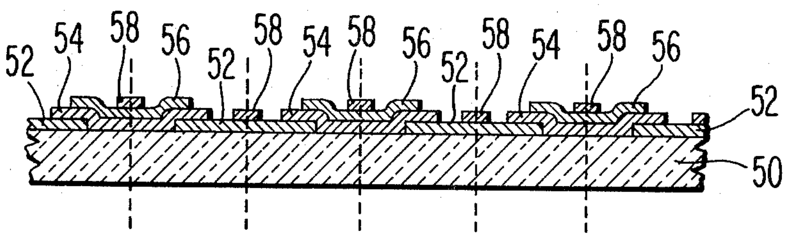
FIGURE 4 is a sectional view illustrating a method of making the form of the electroluminescent semiconductor device shown in FIGURE 3.

As shown in FIG. 4, the electroluminescent semiconductor device 36 can be made by coating the surface of a layer wafer 50 of the electrically insulating material with spaced, parallel thin layer strips 52 of conductive gallium nitride. This can be achieved by the first applying masking layers, such as of silicon dioxide, on the portions of the wafer surface which are to be the spaces between the strips 52 and then epitaxially depositing the strips 52 by the vapor phase epitaxy technique previously referred to. After the masking layers are removed, such as by a chemical etchant, to expose the surface of the wafer 50 between the strips 52, thin layer strips 54 of insulating gallium nitride are coated on the exposed portions of the surface of the wafer 50 by the vapor phase epitaxy technique. Each of the insulating gallium arsenide strips 54 also extends over the edge portions of each of the adjacent conductive gallium nitride strips 52. Prior to depositing the insulating gallium nitride strips 54, a masking layer is coated along the central portion of each of the conductive gallium nitride strips 52 so as to define the area of each of the insulating gallium nitride strips 54. After the insulating gallium nitride strips 54 are deposited, the edge portions of the insulating gallium nitride strips 54 and the central portions of the conductive gallium nitride strips 54 are coated with a masking layer. A second set of thin layer strips 56 of conductive gallium nitride are then deposited by vapor phase epitaxy on the exposed central portions of the insulating gallium nitride strips 54. After removing the masking layers, narrow, elongated contact pads 58 of an electrically conductive metal are coated on the central portion of each of the conductive gallium nitride strips 52 and 56. The contact pads 58 may be applied by any well known technique, such as by vacuum evaporation through a mask. The wafer 50 and the various layers thereon are then divided along lines extending along the centers of the contact pads 58 as indicated by the dash line in FIG. 4. This divides the wafer into the individual electroluminescent semiconductor device 36.

In the use of the electroluminescent semiconductor device 36, the contact pads 46 and 48 are electrically connected across a source of D.C. current. This provides a flow of current through the insulating gallium nitride layer 42 between the conductive gallium nitride layers 40 and 44. This generates light in the insulating gallium nitride layer 42 and the light is emitted therefrom. The electroluminescent semiconductor device 36 can be used as an individual light source or a plurality of the devices can be arrange in a desired pattern to form a display, such as a numeric display.

I claim:

1. An electroluminescent semiconductor device comprising a body of insulating crystalline gallium nitride and a pair of contacts electrically connected to spaced points on said body and a D.C. bias between said contacts.

2. An electroluminescent semiconductor device in accordance with claim 1 in which the body contains a sufficient amount of an acceptor impurity to compensate all of the donors in the body to make the body insulating.

3. An electroluminescent semiconductor device in accordance with claim 1 in which at least one of the contacts includes a region of electrically conductive crystalline gallium nitride engaging a surface of the body.

4. An electroluminescent semiconductor device in accordance with claim 3 in which each of the contacts includes a region of electrically conductive crystalline gallium nitride and at least a portion of the body is sandwiched between said regions.

5. An electroluminescent semiconductor device in accordance with claim 1 in which the body is on a substrate of an electrically insulating material.

6. An electroluminescent semiconductor device in accordance with claim 5 including a region of electrically conductive crystalline gallium nitride between the substrate, the body, a metal contact on said region and a metal contact on the body.

7. An electroluminescent semiconductor device in accordance with claim 5 including a first layer of conductive crystalline gallium nitride on a portion of a surface of the substrate, the body is a layer on said surface of the substrate and overlapping a portion of the first layer, and a second layer of conductive crystalline gallium nitride is on said body and overlaps a portion of said first layer so that a portion of said body is sandwiched between said layers.

8. An electroluminescent semiconductor device in accordance with claim 7 including separate metal contact pads on each of said layers.

* * * * *